United States Patent
Liu et al.

(10) Patent No.: US 10,114,096 B2
(45) Date of Patent: Oct. 30, 2018

(54) MULTI-SLICE MAGNETIC RESONANCE DATA ACQUISITION METHOD AND IMAGING APPARATUS

(71) Applicant: Siemens Healthcare GmbH, Erlangen (DE)

(72) Inventors: Wei Liu, Shenzhen (CN); Zhi Guo Sun, Shenzhen (CN)

(73) Assignee: Siemens Healthcare GmbH, Erlangen (DE)

(*) Notice: Subject to any disclaimer, the term of this patent is extended or adjusted under 35 U.S.C. 154(b) by 494 days.

(21) Appl. No.: 14/974,117

(22) Filed: Dec. 18, 2015

(65) Prior Publication Data

US 2016/0178719 A1    Jun. 23, 2016

(30) Foreign Application Priority Data

Dec. 18, 2014  (CN) .......................... 2014 1 0789507

(51) Int. Cl.
*G01V 3/00*     (2006.01)
*G01R 33/483*   (2006.01)

(52) U.S. Cl.
CPC ................. *G01R 33/4835* (2013.01)

(58) Field of Classification Search
USPC ....................................................... 324/309
See application file for complete search history.

(56) References Cited

U.S. PATENT DOCUMENTS

| | | | | |
|---|---|---|---|---|
| 6,167,293 | A * | 12/2000 | Chenevert | G01R 33/563 324/306 |
| 9,116,219 | B1 * | 8/2015 | Posse | G01R 33/5608 |
| 2006/0115429 | A1 * | 6/2006 | Afeyan | A61K 49/0004 424/9.1 |
| 2010/0054559 | A1 * | 3/2010 | Narayanan | G06T 7/0016 382/128 |
| 2014/0247046 | A1 * | 9/2014 | Grinstead | G01R 33/4835 324/309 |
| 2016/0170000 | A1 * | 6/2016 | Liu | G06T 11/005 382/131 |
| 2017/0343635 | A1 * | 11/2017 | Salerno | G01R 33/5601 |

* cited by examiner

*Primary Examiner* — Rodney Fuller
(74) *Attorney, Agent, or Firm* — Schiff Hardin LLP

(57) ABSTRACT

In a multi-slice data acquisition method and device and a magnetic resonance imaging method and apparatus, a number $N_C$ of fractional acquisitions and a number $N_S$ of slice individual, complete data acquisition of the multi-slice data acquisition are determined. Using an iterative odd/even arranging method, a slice data acquisition order of each of the fractional acquisitions is arranged according to an ideal number of iterations. The ideal number of iterations is obtained from multiple undetermined numbers j of iterations of the iterative odd/even arranging method according to the number $N_S$ of slice data and the number $N_C$ of fractional acquisitions. This multi-slice data acquisition method optimizes the slice data acquisition order so as to significantly reduce the effect of magnetization transfer and crosstalk.

15 Claims, 4 Drawing Sheets

MULTI-SLICE MAGNETIC RESONANCE DATA ACQUISITION METHOD AND IMAGING APPARATUS

BACKGROUND OF THE INVENTION

Field of the Invention

The present invention relates to the field of magnetic resonance imaging, in particular a multi-slice data acquisition method for a magnetic resonance imaging system.

Description of the Prior Art

Magnetic resonance imaging (MRI) is a technology in which the phenomenon of magnetic resonance is utilized for the purpose of imaging. The basic principles of magnetic resonance are as follows: when an atomic nucleus contains a single proton, as is the case with the nuclei of the hydrogen atoms that are present throughout the human body, this proton exhibits spin motion and resembles a small magnet. The spin axes of these small magnets lack an adhesive pattern, but when an external magnetic field is applied, the small magnets will be rearranged according to the magnetic force lines of the external magnetic field. Specifically, they will align in two directions, either parallel or anti-parallel to the magnetic force lines of the external magnetic field. The direction parallel to the magnetic force lines of the external magnetic field is called the positive longitudinal axis, while the direction anti-parallel to the magnetic force lines of the external magnetic field is called the negative longitudinal axis. The atomic nuclei only have a longitudinal magnetization component, which has both a direction and a magnitude. A radio frequency (RF) pulse of a specific frequency is used to excite the atomic nuclei in the external magnetic field such that their spin axes deviate from the positive longitudinal axis or negative longitudinal axis, giving rise to resonance—this is the phenomenon of magnetic resonance. Once the spin axes of the excited atomic nuclei have deviated from the positive or negative longitudinal axis the atomic nuclei have a transverse magnetization component.

Once emission of the RF pulse has ended, the excited atomic nuclei emit an echo signal, gradually releasing the absorbed energy in the form of electromagnetic waves, such that their phase and energy level both return to the pre-excitation state. An image can be reconstructed by subjecting the echo signal emitted by atomic nuclei to further processing, such as spatial encoding.

The Half-Fourier Acquisition Single-shot Turbo spin Echo (HASTE) sequence is a turbo spin echo (TSE) technique that uses a single-shot method to acquire sufficient data for an entire image in the repetition time (TR) of a single excitation pulse. Multi-slice HASTE is widely used in clinical imaging research to obtain transverse relaxation time (T2)-weighted images. Due to its relatively short acquisition time, multi-slice HASTE is often used in breath-hold abdominal imaging. A non-ideal slice shape of a selective RF pulse will lead to excitation of neighboring regions, which must be avoided. Adjacent slices will be partially saturated so that the signal generated will be reduced. Unless an extremely long repetition time (TR) is used, crosstalk between slices may cause artefacts or a decrease in signal-to-noise ratio in two-dimensional acquisition. When a TSE sequence is used, these phenomena are more pronounced. Furthermore, an RF pulse sequence for a given slice can serve as an off-resonance magnetization transfer (MT) pulse for another slice, leading to contrast alteration and signal attenuation induced by magnetization transfer. Specifically, compared to TSE sequences having shorter echo chains, the HASTE sequence will induce a greater magnetization transfer effect.

SUMMARY OF THE INVENTION

An object of the present invention is to provide a multi-slice data acquisition and ordering method for an MRI system.

This object is achieved by such a method according to the invention that has a determining step executed in processor, wherein a number $N_C$ of fractional acquisitions and a number $N_S$ of individual, complete slice data acquisitions of a multi-slice raw data acquisition that is to be executed by a scanner of a magnetic resonance apparatus. In an arranging step also executed in the processor, an iterative odd/even arranging method is implemented to arrange a slice data acquisition order of each of the fractional acquisitions according to an ideal number of iterations, wherein the ideal number of iterations is obtained from multiple undetermined numbers j of iterations of the iterative odd/even arranging method according to the number $N_S$ of slice data and the number $N_C$ of fractional acquisitions. An electronic signal that designates the determined slice acquisition order is emitted from the processor in a form for controlling the scanner so as to execute the multi-slice data acquisition with data for the respective slices being acquired according to the determined slice acquisition order, Preferably, the arranging step includes using a first ordering general formula to judge the undetermined number j of iterations and, if the undetermined number j of iterations satisfies the first ordering general formula, then the undetermined number j of iterations is taken to be the ideal number of iterations; otherwise the undetermined number j of iterations is replaced one by one and another judgment is made. The first ordering general formula is $$T_{S+i}^j - T_S^j \geq N_S \times TR/N_C/i + T_P;$$

$$i=1, 2, 3$$

wherein $T_S^j$ is the excitation time of the $S^{th}$ slice after j iterations, TR is the repetition time of the excitation pulses, and $T_P$ is the time interval between adjacent fractional acquisitions.

Preferably, the time interval $T_P$ between adjacent fractional acquisitions is equal to 0 or another set value.

Preferably, the arranging step includes using a second ordering general formula to judge the undetermined number j of iterations, and if the undetermined number j of iterations satisfies the second ordering general formula, then the undetermined number j of iterations is taken to be the ideal number of iterations; otherwise the undetermined number j of iterations is replaced one by one and another judgment is made.

The second ordering general formula is $$T_{S+i}^j - T_S^j \geq 2 \text{ seconds};$$

$$i=1, 2, 3$$

wherein $T_S^j$ is the excitation time of the $S^{th}$ slice after j iterations.

Preferably, the step of replacing the undetermined number j of iterations one by one includes setting the undetermined number j of iterations to be a natural number which increases one by one starting from zero.

The present invention also provides an MRI method, including the multi-slice data acquisition and ordering device described above. In order to implement the actual imaging, the multi-slice raw data acquired as described above are used in a reconstruction algorithm executed in reconstruction processor in order to generate image data.

The present invention also provides a multi-slice data acquisition and ordering device for an MRI system, the device having a computer that has a processor, module or stage configured to determine a number $N_C$ of fractional acquisitions and a number $N_S$ of individual, complete slice data acquisitions of a multi-slice data acquisition provided to the computer. An electronic signal that designates the determined slice acquisition order is emitted from the computer in a form for controlling the scanner so as to execute the multi-slice data acquisition with data for the respective slices being acquired according to the determined slice acquisition order. The computer also has an arranging processor, stage of module configured to use an iterative odd/even arranging method to arrange a slice data acquisition order of each of the fractional acquisitions according to an ideal number of iterations, wherein the ideal number of iterations is obtained from multiple undetermined numbers j of iterations of the iterative odd/even arranging method according to the number $N_S$ of slice data and the number $N_C$ of fractional acquisitions.

Preferably, the arranging processor is configured to use a first ordering general formula to judge the undetermined number j of iterations and, if the undetermined number j of iterations satisfies the first ordering general formula, then the undetermined number j of iterations is taken to be the ideal number of iterations; otherwise the undetermined number j of iterations is replaced one by one and another judgment is made.

The arranging processor is configured to use, as the first ordering general formula:

$$T_{S+i}^{j} - T_S^{j} \geq N_S \times TR/N_C/i + T_P;$$

i=1, 2, 3 wherein $T_S^j$ is the excitation time of the $S^{th}$ slice after j iterations, TR is the repetition time of the excitation pulses, and $T_P$ is the time interval between adjacent fractional acquisitions.

Preferably, the iteration processor is configured to use a second ordering general formula to judge the undetermined number j of iterations, wherein if the undetermined number j of iterations satisfies the second ordering general formula, then the undetermined number j of iterations is taken to be the ideal number of iterations; otherwise the undetermined number j of iterations is replaced one by one and another judgment is made.

The iteration processor is configured to use, as the second ordering general formula is:

$$T_{S+i}^{j} - T_S^{j} \geq 2 \text{ seconds};$$

i=1, 2, 3 wherein $T_S^j$ is the excitation time of the $S^{th}$ slice after j iterations.

The present invention also provides an MRI system, having a scanner and a multi-slice data acquisition ordering computer as described above. An electronic signal that designates the determined slice acquisition order is emitted from the computer in a form for controlling the scanner so as to execute the multi-slice data acquisition with data for the respective slices being acquired according to the determined slice acquisition order.

The slice data acquisition method according to the present invention optimizes the slice data acquisition order so as to significantly reduce the aforementioned effect of magnetization transfer and crosstalk. With the optimized slice data acquisition order, the slice data acquisition method according to the present invention makes the acquisition time shorter. The repetition time of the excitation pulses is shortened significantly, while the signal-to-noise ratio and contrast are preserved.

DESCRIPTION OF THE PREFERRED EMBODIMENTS

Technical solutions and advantages of the present invention are explained in detail below by exemplary embodiments of the invention.

Various methods for reducing crosstalk exist. Firstly, placing spatial gaps between adjacent slices: in the case of SINC pulses, gaps of as much as 50% of the slice thickness are needed to compensate for crosstalk; in the case of other optimized pulses, much smaller gaps can be used (about 10% of the slice thickness). Secondly, changing the slice acquisition order and increasing the effective gap (actual gap) between slices that are excited in order): after acquiring every second slice (odd/even acquisition order), the effect of crosstalk in the remaining slices can be substantially reduced by means of a longitudinal relaxation (T1) process; in fact, the number of fractional acquisitions is generally set to 2, and a staggered slice sequence is used to prevent crosstalk.

Although the magnetization transfer effect is more troublesome than crosstalk because magnetization transfer cannot be alleviated by improving slice characteristics, the magnetization transfer effect can be reduced to a certain extent by increasing the slice gap and changing the order in which slices are excited. However, in some applications the slice gap cannot be increased in large amounts, because small pathological changes might be missed. Especially in the case of imaging with thin slices, after simple odd/even ordering of slices, artefacts induced by crosstalk and the magnetization transfer effect cannot possibly be eliminated completely.

The basic feature of the two-dimensional multi-slice data acquisition and ordering method for an MRI system according to a particular embodiment of the present invention is to implement an iterative odd/even slice ordering method so as to maximize an effective gap between slices excited in order. The criterion for ordering slices is: the smaller the separation in a spatial dimension, the longer the separation in a time dimension.

Specifically, to maximize the effective gap between slices excited in order and the time interval between adjacent slice positions, slices are staggered iteratively until all criteria are satisfied. In theory, the smaller the separation of slices in the spatial dimension, the longer the acquisition time interval between two slices in the time dimension. In fact, in the case of a relatively large effective gap (>100% of the slice thickness), the effect of crosstalk is negligible. Furthermore, when a relatively large effective gap is used, the off-resonance frequency arising from RF pulses of adjacent slices will increase, and this will lead to a decrease in signal attenuation induced by magnetization transfer.

Figure 1:
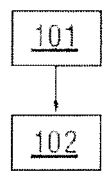
FIG. 1 is a flowchart of the slice data acquisition method according to an embodiment of the present invention.

FIG. 1 is a flowchart of the slice data acquisition method according to a particular embodiment of the present invention. As FIG. 1 shows, a multi-slice data acquisition and ordering method for an MRI system according to a particular embodiment of the present invention is used to acquire a number $N_S$ of slice data.

In step 101, a number $N_C$ of fractional acquisitions and a number $N_S$ of slice data of the multi-slice data acquisition are determined.

The slice data acquisition method according to a particular embodiment of the present invention is based on a fractional acquisition method for an MRI system, wherein the number $N_C$ of fractional acquisitions and the number $N_S$ of slice data are determined by a user by means of an operating system of the MRI system. For example, when the number $N_C$ of fractional acquisitions is equal to 2 and the number $N_S$ of slice data is equal to 10, the slice data acquired the first time are $1^{st}$, $3^{rd}$, $5^{th}$, $7^{th}$ and $9^{th}$ slice data, and the slice data acquired the second time are $2^{nd}$, $4^{th}$, $6^{th}$, $8^{th}$ and $10^{th}$ slice data; when the number $N_C$ of fractional acquisitions is equal to 3 and the number $N_S$ of slice data is equal to 15, the slice data acquired the first time are $1^{st}$, $4^{th}$, $7^{th}$, $10^{th}$ and $13^{th}$ slice data, the slice data acquired the second time are $2^{nd}$, $5^{th}$, $8^{th}$, $11^{th}$ and $14^{th}$ slice data, and the slice data acquired the third time are $3^{rd}$, $6^{th}$, $9^{th}$, $12^{th}$ and $15^{th}$ slice data.

In step 102, using an iterative odd/even arranging method is used to arrange a slice data acquisition order of each of the fractional acquisitions according to an ideal number of iterations, wherein an undetermined number j of iterations of the iterative odd/even arranging method is judged according to the number $N_S$ of slice data and the number $N_C$ of fractional acquisitions.

Figure 2:
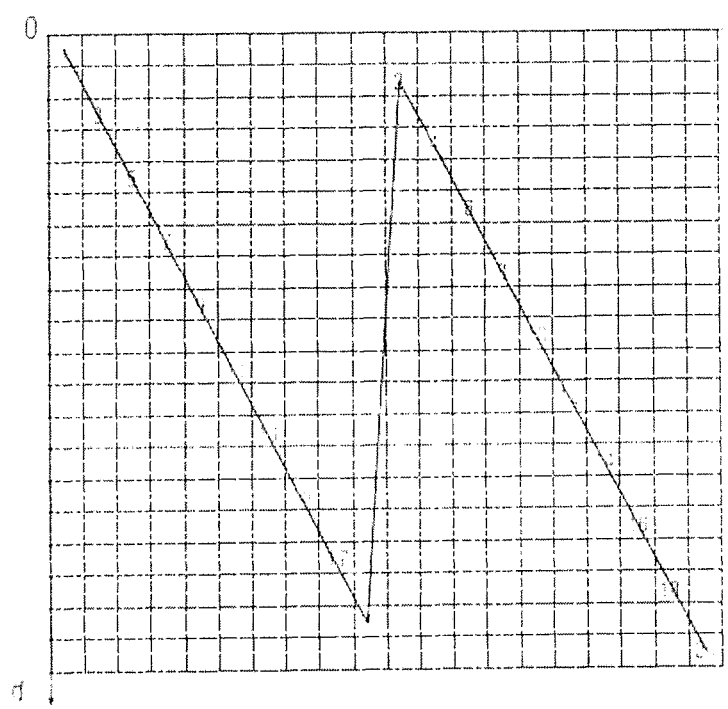
FIG. 2 schematically illustrates the space-time relationship for slice acquisition with the number of iterations being zero in the slice data acquisition method according to an embodiment of the present invention.
Figure 3:
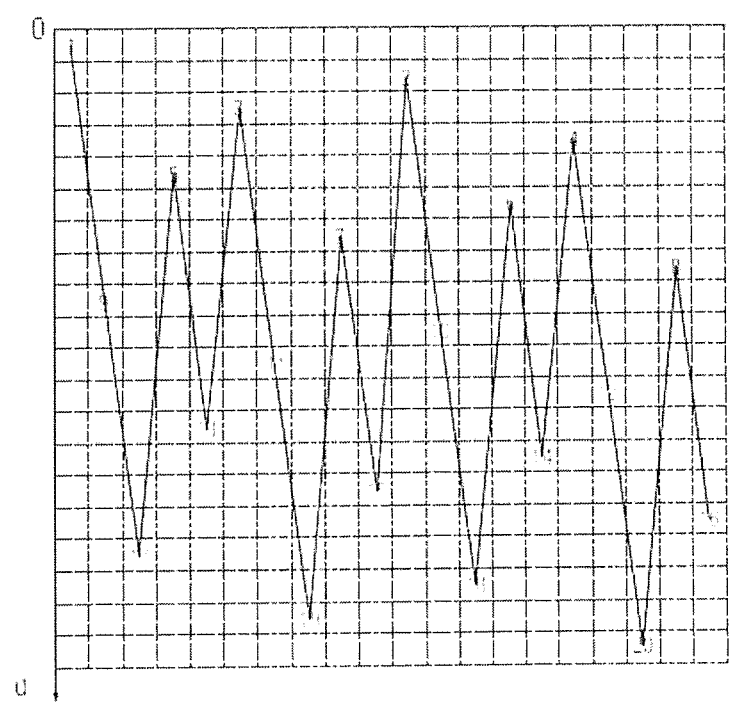
FIG. 3 schematically illustrates the space-time relationship for slice acquisition with one iteration in the slice data acquisition method according to another embodiment of the present invention.

FIG. 2 is a schematic diagram showing the space-time relationship for slice acquisition with the number of iterations being zero in the slice data acquisition method according to a particular embodiment of the present invention, while FIG. 3 is a schematic diagram showing the space-time relationship for slice acquisition with one iteration in the slice data acquisition method according to a particular embodiment of the present invention, wherein the horizontal axis represents scanning time, and the vertical axis represents scanning space.

When the number $N_C$ of fractional acquisitions is equal to 2 and the number $N_S$ of slice data is equal to 20, the slice data acquired the first time are $1^{st}$, $3^{rd}$, $5^{th}$, $7^{th}$, $9^{th}$, $11^{th}$, $13^{th}$, $15^{th}$, $17^{th}$ and $19^{th}$ slice data, and the slice data acquired the second time are $2^{nd}$, $4^{th}$, $6^{th}$, $8^{th}$, $10^{th}$, $12^{th}$, $14^{th}$, $16^{th}$, $18^{th}$ and $20^{th}$ slice data.

An iterative odd/even arranging method is used to arrange a slice data acquisition order of each of the fractional acquisitions according to different numbers of iterations, at least including the two slice data acquisition orders shown in FIGS. 2 and 3. As FIG. 2 shows, when the 3rd, 5th, 7th, number of iterations is 0, the slice data acquisition order of the first acquisition is $1^{st}$, $9^{th}$, $11^{th}$, $13^{th}$, $15^{th}$, $17^{th}$ and $19^{th}$ slice data, and the slice data acquisition order of the second acquisition is $2^{nd}$, $4^{th}$, $6^{th}$, $8^{th}$, $10^{th}$, $12^{th}$, $14^{th}$, $16^{th}$, $18^{th}$ and $20^{th}$ slice data. However, the order in which slices are excited is by no means optimized in this case. The reason is that the time interval is too short between slices. Therefore a specific criterion is needed to select the number of iterations so as to prevent insufficient staggering in slice acquisition.

As FIG. 3 shows, when the number of iterations is 2, the slice data acquisition order of the first acquisition is $1^{st}$, $9^{th}$, $17^{th}$, $5^{th}$, $13^{th}$, $3^{rd}$, $11^{th}$, $19^{th}$, $7^{th}$ and $15^{th}$ slice data, and the slice data acquisition order of the second acquisition is $2^{nd}$, $10^{th}$, $18^{th}$, $6^{th}$, $14^{th}$, $4^{th}$, $12^{th}$, $20^{th}$, $8^{th}$ and $16^{th}$ slice data. However, the order in which slices are excited is by no means optimized in this case. The reason is that the time interval is too short between slices 13 and 11 (and also slices 14 and 12). Therefore a specific criterion is needed to select the number of iterations so as to prevent excessive staggering of slices.

When the effective slice gap is more than 3 times the slice thickness or the time interval is more than 2 seconds, the effect of magnetization transfer and crosstalk is negligible. The lower limit value of the time interval between adjacent slice positions is attributed to consideration of the longitudinal relaxation process. To shorten the repetition time while maintaining as far as possible a similar signal-to-noise ratio and contrast, the lower limit value of the time interval can be specified as a function of effective gap, repetition time, fractional acquisition and total number of slices. The number $N_C$ of fractional acquisitions is equal to 2 and the number $N_S$ of slice data is equal to 20, and the same principle also applies to other numbers $N_C$ of fractional acquisitions and numbers $N_S$ of slice data.

In this case, the ideal number of iterations in the iterative odd/even arranging method can be determined in various ways.

One example is executed in step 102 by using a first ordering general formula to judge, one-by-one the undetermined number j of iterations wherein, if the number j of iterations satisfies the first ordering general formula, then the undetermined number j of iterations is taken to be the ideal number of iterations; otherwise 1 is added to the number j of iterations and another judgment is made.

The first ordering general formula is $$T_{S+i}^{\,j} - T_S^{\,j} \geq N_S \times TR/N_C/i + T_P,$$

$$i=1, 2, 3$$

wherein $T_S^{\,j}$ is the excitation time of the $S^{th}$ slice after j iterations, TR is the repetition time of the excitation pulses, and $T_P$ is the time interval between adjacent fractional acquisitions.

In other words, when the interval $T_P$ of adjacent fractional acquisitions is equal to 0 and the undetermined number of iterations is j, and if the following inequalities are satisfied, then iteration can be stopped, and the undetermined number j of iterations at this time is taken to be the ideal number of iterations, otherwise 1 is added to the number j of iterations and another judgment is made.

$$T_{S+1}^{\,j} - T_S^{\,j} \geq N_S \times TR/N_C/1$$

$$T_{S+2}^{\,j} - T_S^{\,j} \geq N_S \times TR/N_C/2$$

$$T_{S+3}^{\,j} - T_S^{\,j} \geq N_S \times TR/N_C/3$$

The interval $T_P$ between adjacent fractional acquisitions may also be equal to other set values, for example, the time for which an examination subject holds his/her breath.

According to the above algorithm, in the case where the number $N_C$ of fractional acquisitions is equal to 2 and the number $N_S$ of slice data is equal to 20, when the ideal number j of iterations is 1, thus the slice data acquisition order of the first acquisition is $1^{st}$, $5^{th}$, $9^{th}$, $13^{th}$, $17^{th}$, $3^{rd}$, $7^{th}$, $11^{th}$, $15^{th}$ and $19^{th}$ slice data, and the slice data acquisition order of the second acquisition is $2^{nd}$, $6^{th}$, $10^{th}$, $14^{th}$, $18^{th}$, $4^{th}$, $8^{th}$, $12^{th}$, $16^{th}$ and $20^{th}$ slice data.

Another example is executed in step 102 by using a second ordering general formula to judge the undetermined number j of iterations, wherein if the number j of iterations satisfies the second ordering general formula, then the undetermined number j of iterations is taken to be the ideal number of iterations; otherwise 1 is added to the number j of iterations and another judgment is made, wherein the second ordering general formula is:

$$T_{S+i}^{j} - T_S^{j} \geq 2 \text{ seconds};$$

$$i=1, 2, 3$$

wherein $T_S^j$ is the excitation time of the $S^{th}$ slice after j iterations.

Specifically, in the case where a HASTE sequence is combined with two breath-holds, the time interval between odd and even slices is always more than 2 seconds. In FIG. 2 the number $N_C$ of fractional acquisitions is equal to 2 and the number $N_S$ of slice data is equal to 20, and the same principle also applies to other numbers $N_C$ of fractional acquisitions and numbers $N_S$ of slice data.

Figure 4:
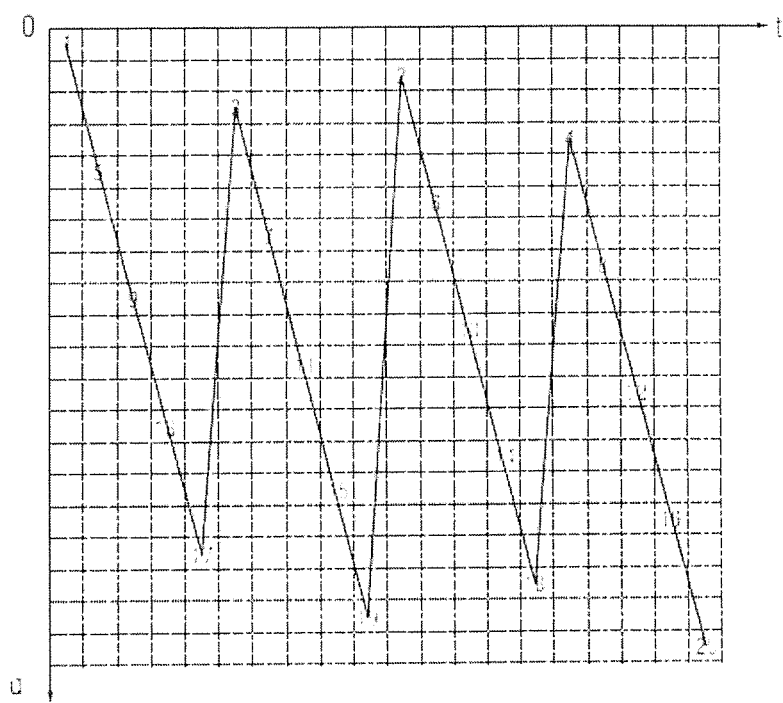
FIG. 4 schematically illustrates the space-time relationship for slice acquisition with two iterations in the slice data acquisition method according to a further embodiment of the present invention.

FIG. 4 is a schematic diagram showing the space-time relationship for slice acquisition with two iterations in the slice data acquisition method according to a particular embodiment of the present invention, wherein the horizontal axis represents scanning time, and the vertical axis represents scanning space. As FIG. 4 shows, in the method according to a particular embodiment of the present invention, when the number of iterations is 1, the slice data acquisition order of the first acquisition is are $1^{st}$, $5^{th}$, $9^{th}$, $13^{th}$, $17^{th}$, $3^{rd}$, $7^{th}$, $11^{th}$, $15^{th}$ and $19^{th}$ slice data, and the slice data acquisition order of the second acquisition is $2^{nd}$, $6^{th}$, $10^{th}$, $14^{th}$, $18^{th}$, $4^{th}$, $8^{th}$, $12^{th}$, $16^{th}$ and $20^{th}$ slice data. Thus, the slice data acquisition method according to a particular embodiment of the present invention can optimize the slice data acquisition order during odd/even arranging with one iteration, so as to significantly reduce the effect of magnetization transfer and crosstalk.

The slice data acquisition method according to the present invention allows a new ordering flow with regard to a HASTE sequence, but the slice data acquisition method according to a particular embodiment of the present invention also applies to multi-shot TSE sequences, as long as the order of continuous excitation of the same slices is kept unchanged, and only the ordering of slices is changed.

Following the optimized slice data acquisition order, the slice data acquisition method according to a particular embodiment of the present invention makes the acquisition time shorter. The repetition time of the excitation pulses is shortened significantly, while the signal-to-noise ratio and contrast are preserved.

To maximize the effective gap between slices excited in order and the time interval between adjacent slice positions, the slice data acquisition method according to a particular embodiment of the present invention uses an iterative odd/even arranging method to arrange the slice data acquisition order until all criteria are satisfied.

To shorten the repetition time of excitation pulses while preserving as far as possible the signal-to-noise ratio and contrast, the slice data acquisition method according to a particular embodiment of the present invention specifies the lower limit value of the time interval to be a function of effective gap, number of fractional acquisitions and total number of slices.

The slice data acquisition method according to the present invention is only focused on the slice data acquisition order, without taking into account continuous excitation of the same slices, but based on this framework, the slice data acquisition method according to a particular embodiment of the present invention applies to other multi-slice imaging.

The slice data acquisition method according to the present invention may be widely used in HASTE sequences, in particular for breath-hold abdominal imaging. The slice data acquisition method according to a particular embodiment of the present invention allows a shorter breath-hold duration or even a single breath-hold because the acquisition time is reduced. With regard to TSE sequences, the slice data acquisition method according to the present invention also allows that the repetition time of excitation pulses to be reduced, while preserving the signal-to-noise ratio and contrast, and this will further reduce the measurement time.

Although modifications and changes may be suggested by those skilled in the art, it is the intention of the inventors to embody within the patent warranted hereon all changes and modifications as reasonably and properly come within the scope of their contribution to the art.

We claim as our invention:

1. A multi-slice data acquisition and ordering method for a magnetic resonance imaging (MRI) apparatus, said method comprising:
   in a computer, automatically determining a number $N_C$ of fractional acquisitions and a number $N_S$ of individual, complete slice data acquisitions of a multi-slice data acquisition to be executed by an MR scanner;
   in said computer, using an iterative odd/even arranging algorithm to arrange a slice data acquisition order of each of the fractional acquisitions according to an ideal number of iterations, and obtaining the ideal number of iterations from multiple undetermined numbers j of iterations of the iterative odd/even arranging algorithm according to the number $N_S$ of individual complete slice data acquisitions and the number $N_C$ of fractional acquisitions; and
   said computer being configured to generate an electronic signal that designates the determined slice acquisition order, and to emit said electronic signal from said computer in a form for controlling the scanner so as to execute the multi-slice data acquisition with data for the respective slices being acquired according to the determined slice acquisition order.

2. The multi-slice data acquisition and ordering method as claimed in claim 1, comprising using an ordering general formula to judge the undetermined number j of iterations wherein, if the undetermined number j of iterations satisfies the first ordering general formula, then the undetermined number j of iterations is taken to be the ideal number of iterations, otherwise the undetermined number j of iterations is replaced one by one and another judgment is made, and wherein the first ordering general formula is $$T_{S+i}{}^j - T_S{}^j \geq N_S \times TR/N_C/i + T_P;$$

i=1, 2, 3 wherein $T_S{}^j$ is the excitation time of the $S^{th}$ slice after j iterations, TR is the repetition time of the excitation pulses, and $T_P$ is the time interval between adjacent fractional acquisitions.

3. The multi-slice data acquisition and ordering method as claimed in claim 2, wherein the time interval $T_P$ between adjacent fractional acquisitions is equal to 0 or another set value.

4. The multi-slice data acquisition and ordering method as claimed in claim 2, wherein said ordering general formula is a first ordering general formula, and comprising using a second ordering general formula to judge the undetermined number j of iterations,
   wherein if the undetermined number j of iterations satisfies the second ordering general formula, then the undetermined number j of iterations is taken to be the ideal number of iterations, otherwise the undetermined number j of iterations is replaced one by one and another judgment is made,
   wherein the second ordering general formula is $$T_{S+i}{}^j - T_S{}^j \geq 2 \text{ seconds};$$

i=1, 2, 3 wherein TS is the excitation time of the $S^{th}$ slice after j iterations.

5. The multi-slice data acquisition and ordering method as claimed in claim 4, wherein replacing the undetermined number j of iterations one by one comprises setting the undetermined number j of iterations to be a natural number which increases one by one starting from zero.

6. The multi-slice data acquisition and ordering method as claimed in claim 1, comprising using an ordering general formula to judge the undetermined number j of iterations,
   wherein if the undetermined number j of iterations satisfies the second ordering general formula, then the undetermined number j of iterations is taken to be the ideal number of iterations, otherwise the undetermined number j of iterations is replaced one by one and another judgment is made,
   wherein the second ordering general formula is
$$T_{S+i}{}^j - T_S{}^j \geq 2 \text{ seconds};$$

i=1, 2, 3 wherein $T_S{}^j$ is the excitation time of the $S^{th}$ slice after j iterations.

7. A multi-slice data acquisition and ordering method as claimed in claim 1 comprising operating said scanner with said multi-slice data acquisition to acquire MR data from a subject situated in the scanner and, in said computer, executing a reconstruction algorithm to generate an image of the subject from said MR data, and making the image of the subject available in electronic form from the computer as a data file.

8. A multi-slice data acquisition and ordering device for a magnetic resonance imaging (MRI) apparatus, said device comprising:
   a computer configured to determine a number $N_C$ of fractional acquisitions and a number $N_S$ of individual, complete acquisition slice data of a multi-slice data acquisition to be executed by an MR scanner;
   said computer being configured to use an iterative odd/even arranging algorithm to arrange a slice data acquisition order of each of the fractional acquisitions according to an ideal number of iterations, and obtaining the ideal number of iterations from multiple undetermined numbers j of iterations of the iterative odd/even arranging algorithm according to the number $N_S$ of individual complete slice data acquisitions and the number $N_C$ of fractional acquisitions; and
   said computer being configured to generate an electronic signal that designates the determined slice acquisition order, and to emit said electronic signal from said computer in a form for controlling the scanner so as to execute the multi-slice data acquisition with data for the respective slices being acquired according to the determined slice acquisition order.

9. The multi-slice data acquisition and ordering device as claimed in claim 8, wherein said computer is configured to use an ordering general formula to judge the undetermined number j of iterations wherein, if the undetermined number j of iterations satisfies the first ordering general formula, then the undetermined number j of iterations is taken to be the ideal number of iterations, otherwise the undetermined number j of iterations is replaced one by one and another judgment is made, and wherein the first ordering general formula is $$T_{S+i}{}^j - T_S{}^j \geq N_S \times TR/N_C/i + T_P;$$

i=1, 2, 3 wherein $T_S$ is the excitation time of the $S^{th}$ slice after j iterations, TR is the repetition time of the excitation pulses, and $T_P$ is the time interval between adjacent fractional acquisitions.

10. The multi-slice data acquisition and ordering device as claimed in claim 9, wherein the time interval $T_P$ between adjacent fractional acquisitions is equal to 0 or another set value.

11. The multi-slice data acquisition and ordering device as claimed in claim 9, wherein said ordering general formula is a first ordering general formula, and wherein said computer is configured to use a second ordering general formula to judge the undetermined number j of iterations,
   wherein if the undetermined number j of iterations satisfies the second ordering general formula, then the undetermined number j of iterations is taken to be the ideal number of iterations, otherwise the undetermined number j of iterations is replaced one by one and another judgment is made, wherein the second ordering general formula is $$T_{S+i}{}^j - T_S{}^j \geq 2 \text{ seconds};$$

i=1, 2, 3 wherein $T_S{}^j$ is the excitation time of the $S^{th}$ slice after j iterations.

12. The multi-slice data acquisition and ordering device as claimed in claim 11, wherein said computer is configured to replace the undetermined number j of iterations one by one comprises setting the undetermined number j of iterations to be a natural number which increases one by one starting from zero.

13. The multi-slice data acquisition and ordering device as claimed in claim 8, wherein said computer is configured to use an ordering general formula to judge the undetermined number j of iterations,
   wherein if the undetermined number j of iterations satisfies the second ordering general formula, then the undetermined number j of iterations is taken to be the ideal number of iterations, otherwise the undetermined number j of iterations is replaced one by one and another judgment is made, wherein the second ordering general formula is $$T_{S+i}{}^j - T_S{}^j \geq 2 \text{ seconds;}$$

i=1, 2, 3 wherein $T_S{}^j$ is the excitation time of the $S^{th}$ slice after j iterations.

14. A multi-slice data acquisition and ordering device as claimed in claim 8 wherein said computer is configured to operate said scanner with said multi-slice data acquisition to acquire MR data from a subject situated in the scanner, and to execute a reconstruction algorithm to generate an image of the subject from said MR data, and to make the image of the subject available in electronic form from the computer as a data file.

15. A magnetic resonance imaging (MRI) apparatus, comprising:

an MR scanner;

a computer configured to automatically determine a number $N_C$ of fractional acquisitions and a number $N_S$ of individual, complete slice data acquisitions of a multi-slice data acquisition to be executed by said MR scanner;

said computer being configured to use an iterative odd/even arranging algorithm to arrange a slice data acquisition order of each of the fractional acquisitions according to an ideal number of iterations, and obtaining the ideal number of iterations from multiple undetermined numbers j of iterations of the iterative odd/even arranging algorithm according to the number $N_S$ of individual complete slice data acquisitions and the number $N_C$ of fractional acquisitions; and said computer being configured to operate said scanner with said multi-slice data acquisition to acquire MR data from a subject situated in the scanner, and to execute a reconstruction algorithm to generate an image of the subject from said MR data, and to make the image of the subject available in electronic form from the computer as a data file.

* * * * *